United States Patent [19]
Okada et al.

[11] Patent Number: 5,326,813
[45] Date of Patent: Jul. 5, 1994

[54] THERMOPLASTIC RESIN COMPOSITION CONTAINING A MODIFIED POLYPHENYLENE ETHER

[75] Inventors: Akihiko Okada; Akitoshi Masuyama, both of Ichihara, Japan

[73] Assignee: Idemitsu Kosan Co., Ltd., Tokyo, Japan

[21] Appl. No.: 988,462

[22] Filed: Dec. 10, 1992

[30] Foreign Application Priority Data

Dec. 10, 1991 [JP] Japan .................................. 3-325796
Jan. 30, 1992 [JP] Japan .................................. 4-014815

[51] Int. Cl.[5] ...................... C08L 71/02; C08F 283/08
[52] U.S. Cl. .................................... 524/508; 524/577; 525/133; 525/333.3; 525/391; 525/397; 525/534; 525/905; 525/392
[58] Field of Search ...................... 524/508; 525/333.3, 525/386, 391, 392, 534, 905, 133, 397

[56] References Cited

U.S. PATENT DOCUMENTS

| | | | |
|---|---|---|---|
| 4,654,405 | 3/1987 | Jalbert et al. | 525/391 |
| 4,746,708 | 5/1988 | Sybert | 525/391 |
| 5,189,103 | 2/1993 | Abe et al. | 525/391 |
| 5,219,951 | 6/1993 | Nelissen et al. | 525/391 |

FOREIGN PATENT DOCUMENTS 0422495  4/1991  European Pat. Off. .

*Primary Examiner*—Paul R. Michl
*Assistant Examiner*—Tae H. Yoon
*Attorney, Agent, or Firm*—Oblon, Spivak, McClelland, Maier & Neustadt

[57] ABSTRACT

There are disclosed a thermoplastic resin composition comprising (A) a styrenic polymer having a high degree of syndiotactic configuration, (B) an inorganic filler and (C) a polyphenylene ether that is modified with a compound having an ethylenic double bond and a polar group in the same molecule, especially maleic anhydride, the ether having a modification rate of 1.3% or more by weight; a thermoplastic resin composition further comprising (D) a rubbery elastomer in addition to the above components (A), (B) and (C); a process for producing modified polyphenylene ether (PPO) comprising reacting 100 parts by weight of PPO with 1 to 20 parts by weight of the above compound or a derivative thereof in an aromatic hydrocarbon solvent in the presence of 15 or less parts by weight of a radical generator; and a process for producing the modified PPO comprising reacting 100 parts by weight of PPO with 1 to 5 parts by weight of the above compound or a derivative thereof at 300° to 350° C. in the presence of 0.1 to 3 parts by weight of a radical generator which exhibits a half-life period of 1 minute at 300° C. or higher. The above thermoplastic resin composition is markedly improved in its dynamical properties especially rigidity and heat resistance.

10 Claims, No Drawings

THERMOPLASTIC RESIN COMPOSITION CONTAINING A MODIFIED POLYPHENYLENE ETHER

BACKGROUND OF THE INVENTION

1. Field of the Invention

The present invention relates to a thermoplastic resin composition. More particularly, it pertains to a thermoplastic resin composition which comprises as the principal component a styrenic polymer having a high degree of syndiotactic configuration, said composition being improved in long-term heat resistant stability by being compounded with a polyphenylene ether that is modified by a compound having an ethylenic double bond and a polar group in the same molecule (particularly typified by maleic anhydride) or a derivative thereof at a modification rate of not less than 1.3% by weight (hereinafter sometimes referred to as "Maleic anyhydride-modified PPO" or simply "Modified PPO"), and at the same time, to a process capable of efficiently producing the Maleic anhydride-modified PPO.

2. Description of Related Art

There has heretofore been adopted the technique for improving various thermoplastic resins in the dynamical properties (or mechanical properties), especially rigidity and heat resistance by compounding therein an inorganic filler such as glass fiber. There are proposed the thermoplastic resin compositions excellent in heat resistance and dynamical properties, for example, in Japanese Patent Application Laid-Open Nos. 257948/1987 and 182344/1990 in which syndiotactic polystyrenes are compounded with an inorganic filler, and a thermoplastic resin and/or rubber together with an inorganic filler, respectively. However, the aforesaid technique has been incapable of producing a satisfactory resin composition even if compounded with an inorganic filler because of the insufficient adhesivity between a syndiotactic polystyrene (SPS) and an inorganic filler.

Such being the case, Japanese Patent Application Laid-Open No. 126743/1991 discloses the improved technique over the aforementioned ones in which a syndiotactic polystyrene is incorporated with a maleic anhydride-modified PPO to provide a resin composition excellent in impact resistance, heat resistance and mechanical properties. The aforesaid improved technique, however, necessitates at least 5% by weight of the maleic anhydride-modified PPO to be incorporated therein for the purpose of sufficienty exhibiting the effect owing to its low modification rate.

Nevertheless it has been found, as a result of long-term heat resistance test for the resin composition incorporated with the maleic anhydride-modified PPO, that the decrease in the molecular weight of the syndiotactic polystyrene (SPS) is made remarkable by the increase in the loading of the maleic anhydride-modified PPO causing deterioration of dynamical properties of the composition, and that a loading thereof of 5% by weight or more further accelerate the aforestated unfavorable tendency. Moreover in order to allow an alloy-based resin composition incorporated with polyamide to exert a sufficient compatibility effect, it is necessary to add a large amount of maleic anhydride-modified PPO to the composition, thus lowering the crystallinity of SPS. Likewise, the decrease in the molecular weight of SPS is inevitable in the long-term heat resistance test for the composition.

SUMMARY OF THE INVENTION

It is an object of the present invention to provide a thermoplastic resin composition excellent in dynamical properties, especially rigidity and long-term heat resistance which is produced from a styrenic polymer having a high degree of syndiotactic configuration compounded with an inorganic filler such as glass fiber.

It is another object of the present invention to provide a thermoplastic resin composition excellent in dynamical properties, especially rigidity and long-term heat resistance which is produced from a styrenic polymer having a high degree of syndiotactic configuration compounded with an inorganic filler such as glass fiber and a rubbery elastomer.

It is still another object of the present invention to provide a process for producing a Maleic anhydride-modified PPO to be effectively compounded in the above-mentioned thermoplastic resin composition.

Specifically the present invention provides as the first aspect thereof a thermoplastic resin composition which comprises (A) 100 parts by weight of a styrenic polymer having a high degree of syndiotactic configuration, (B) 1 to 350 parts by weight of an inorganic filler and (C) 0.1 to 3.5 parts by weight of a Maleic anhydride-modified PPO having a modification rate of 1.3% or more by weight.

In addition, the present invention provides as the second aspect thereof a thermoplastic resin composition which comprises (A) 100 parts by weight of a styrenic polymer having a high degree of syndiotactic configuration, (B) 1 to 350 parts by weight of an inorganic filler, (D) 5 to 100 parts by weight of a rubbery elastomer and (C) 0.1 to 3.5 parts by weight of a Maleic anhydride-modified PPO having a modification rate of 1.3% or more by weight.

Moreover, the present invention provides as the third aspect thereof a process for producing a Maleic anhydride-modified PPO having a modification rate of 1.3% or more by weight which comprises reacting 100 parts by weight of a polyphenylene ether consisting of the repeating units each represented by the general formula (I)

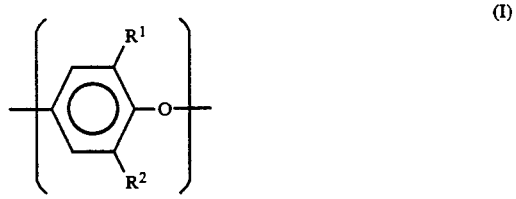

wherein $R^1$ and $R^2$ are each an alkyl group having 1 to 4 carbon atoms or a halogen atom, with 1 to 20 parts by weight of a compound having an ethylenic double bond and a polar group in the same molecule or a derivative thereof in an aromatic hydrocarbon solvent in the presence of 15 or less parts by weight of a radical generator (Process I).

Furthermore, the present invention provides as the fourth aspect thereof a process for producing a Maleic anhydride-modified PPO having a modification rate of 1.3% or more by weight which comprises reacting 100 parts by weight of a polyphenylene ether consisting of the repeating units each represented by the general formula (I), with 1 to 5 parts by weight of a compound having an ethylenic double bond and o polar group in the same molecule or a derivative thereof at a temperature of 300° to 350° C. in the presence of 0.1 to 3 parts by weight of a radical generator which exhibits a half-life period of one (1) minute at 300° C. or higher (Process II).

DESCRIPTION OF PREFERRED EMBODIMENT

There is used a styrenic polymer having a high degree of syndiotactic configuration as the component (A) in the thermoplastic resin composition according to the present invention.

Here, the styrenic polymer which has a high degree of syndiotactic configuration means that its stereochemical structure is of a high degree of syndiotactic configuration, i,e. the stereostructure in which phenyl groups or substituted phenyl groups as side chains are located alternately at opposite directions relative to the main chain consisting of carbon-carbon bonds. Tacticity is quantitatively determined by the nuclear magnetic resonance method ($^{13}$C—NMR method ) using carbon isotope. The tacticity as determined by the $^{13}$C—NMR method can be indicated in terms of proportions of structural units continuously connected to each other, i.e., a diad in which two structural units are connected to each other, a triad in which three structural units are connected to each other and a pentad in which five structural units are connected to each other. "The styrenic polymers having a high degree of syndiotactic configuration as mentioned in the present invention usually means polystyrene, poly(alkylstyrene), poly(halogenated styrene), poly(halogenated alkylstyrene), poly(alkoxystyrene), poly(vinyl benzoate), hydrogenated polymer thereof, the mixture thereof, and copolymers containing the above polymers as main components, having such a syndiotacticity as determined by the above-mentioned method that the proportion of racemic diad is at least 75%, preferably at least 85%, or the proportion of racemic pentad is at least 30%, preferably at least 50%. The poly(alkylstyrene) includes poly(methylstyrene), poly(ethylstyrene), poly(isopropylstyrene), poly(tert-butylstyrene), poly(phenylstyrene), poly(vinylnaphthalene) and poly(vinylstyrene). Poly(halogenated styrene) includes poly(chlorostyrene), poly(bromostyrene) and poly(fluorostyrene). Poly(halogenated alkylstyrene) includes poly(chloromethylstyrene). Poly(alkoxystyrene) includes poly(methoxystyrene), and poly(ethoxystyrene).

The particularly desirable styrenic polymers are polystyrene, poly(p-methylstyrene), poly(m-methylstyrene), poly(p-tert-butylstyrene), poly(p-chlorostyrene), poly(m-chlorostyrene), poly(p-fluorostyrene), hydrogenated polystyrene and the copolymer containing the structural units thereof such as styrene/p-methylstyrene copolymer.

The molecular weight of the styrenic polymer having a high degree of syndiotactic configuration to be used in the present invention is not specifically limited, but is desirably 10,000 or more, more desirably 50,000 or more in terms of weight-average molecular weight. The molecular-weight distribution, that is, the broadening of molecular weight of the styrenic polymer is not specifically limited as well, but may be in a wide range. A weight-average molecular weight of less than 10,000 is unfavorable since the composition or molding obtained is deteriorated thereby in the thermal and mechanical properties.

The styrenic polymer having such a high degree of syndiotactic configuration can be produced with reference to the technique disclosed in Japanese Patent Application Laid-Open No. 187708/1987, specifically by polymerizing a styrenic monomer which corresponds to the above styrenic polymer in the presence or absence of a solvent such as an inert hydrocarbon by the use of a catalyst comprising a titanium compound and a condensation product of water and trialkylaluminum.

In addition, the poly(halogenated alkylstyrene) and the hydrogenated product thereof can be produced by the processes described in Japanese Patent Application Laid-Open Nos. 46912/1989 and 178505/1989, respectively.

As the component (B) which is a constituent of the thermoplastic resin composition according to the present invention, there are available various kinds and forms of inorganic fillers, that is, in the form of fiber, granule, powder and the like.

Examples of fibrous fiber include glass fiber, carbon fiber and whisker in the form of cloth, mat, bound and cut fiber, short fiber, filament, whisker, etc. There is preferably used the bound and cut fiber having a length of 0.05 to 50 mm and a diameter of 5 to 20 μm.

Examples of granular or powdery filler include talc, carbon black, graphite, titanium oxide, silica, mica, calcium carbonate, calcium sulfate, barium carbonate, magnesium carbonate, magnesium sulfate, barium sulfate, oxysulfate, tin oxide, alumina, kaolin, silicon carbide, metallic powder, glass powder, glass flake and glass bead.

Any of the above-mentioned inorganic fillers may be used alone or in combination with at least one of them.

Among the above-mentioned various inorganic fillers are particularly desirable glassy fillers including glass powder, glass flake, glass bead, glass filament, glass fiber, glass roving and glass mat.

In order to enhance the affinity between the aforestated inorganic filler and the resin, it is effective to surface-treat said filler. The coupling agent to be used for the surface treatment may be optionally selected for use from the publicly known silane-based coupling agent of aminosilane, epoxysilane, vinylsilane, methacrylsilane series, etc. and titanium-based coupling agent. Examples of the preferably usable coupling agents among them include aminosilane such as γ-aminopropyltrimethoxysilane, N-β-(aminoethyl)-γ-aminopropyltrimethoxysilane, γ-glycidoxypropyltrimethoxysilane and β-(3,4-epoxy-cyclohexyl)-ethyltrimethoxysilane, epoxysilane, isopropyltri(N-amidoethyl-aminoethyl)titanate, etc.

The surface treatment of the above-mentioned filler by the use of such coupling agent can be carried out by a conventional known method without specific limitation.

The Maleic anhydride-modified PPO which is a constituent of the thermoplastic resin composition according to the present invention as the component (C) and also effective for enhancing the long-term heat resistance is the Maleic anhydride-modified PPO having a modification rate of 1.3% or more by weight which is obtained by modifying the polyphenylene ether consisting of the repeating units each represented by the general formula (I) as described hereinbefore (hereinafter sometimes referred to as "PPO") with a compound having an ethylenic double bond and a polar group in the same molecule or a derivative thereof.

The PPO to be used for the Maleic anhydride-modified PPO is a publicly known compound, and for the purpose of the compound, reference may be made to U.S. Pat. Nos. 3,306,874, 3,306,875, 3,257,357 and 3,257,358.

The PPO is prepared usually by oxidative coupling reaction forming a homopolymer or a copolymer in the presence of at least member selected from a cupramine complex and a mono- to tri-substituted phenol. As the cupramine complex there may be used the cupramine complex derived from any of primary, secondary and tertiary amines.

Specific examples of the usable PPO include poly(2,3-dimethyl-6-ethyl-1,4-phenylene ether), poly(2-methyl-6-chloromethyl-1,4-phenylene ether), poly(2-methyl-6-hydroxyethyl-1,4-phenylene ether), poly(2-methyl-6-n-butyl-1,4-phenylene ether), poly(2-ethyl-6-isopropyl-1,4-phenylene ether), poly( 2-ethyl-6-n-propyl-1,4-phenylene ether), poly(2,3,6-trimethyl-I, 4-phenylene ether), poly[2-(4'-methylphenyl )-1,4-phenylene ether], poly(2-phenyl-1,4-phenylene ether), poly(2-chloro-1,4-phenylene ether, poly(2-methyl-1, 4-phenylene ether), poly(2-chloro-6-ethyl-1,4-phenylene ether), poly(2-chloro-6-bromo-1,4-phenylene ether), poly(2,6-di-n-propyl-l,4-phenylene ether), poly(2-methyl-6-isopropyl-1,4-phenylene ether), poly(2-chloro-6-methyl-l,4-phenylene ether), poly(2-methyl-6-ethyl- 1,4-phenylene ether), poly(2,6-dibromo-l,4-phenylene ether), poly(2,6-dichloro-l,4-phenylene ether), poly(2,6-diethyl-1,4-phenylene ether) and poly(2,6-dimethyl-l,4-phenylene ether). Other suitable examples of the PPO include a copolymer derived from at least two phenolic compounds that are used for the preparation of the above-mentioned homopolymer and a graft copolymer or a block copolymer of an aromatic vinyl compound such as polystyrene and the aforestated polyphenylene ether. Among the above-mentioned PPO, poly(2,6-dimethyl-1,4-phenylene ether) is particularly desirable for use.

The degree of polymerization of the PPO is not specifically limited, but may be suitably selected according to the purpose of use thereof, usually in the range of 60 to 400. A degree of polymerization thereof less than 60 results in little effect as a compatibilizer or an adhesive even if modification is carried out, whereas that exceeding 400 leads to an excessive viscosity thereof, thus causing inconvenience in handling.

In order to produce the Maleic anhydride-modified PPO from the above-mentioned PPO, the PPO may be modified by reacting it with a compound having an ethylenic double bond and a polar Group in the same molecule or a derivative thereof in the presence or absence of a solvent or an other type of resin but in the presence of a radical generator, that is, which is known as solution modification or melt modification.

As the modifier used for modifying the PPO, there is used a compound having an ethylenic double bond and a polar Group such as carboxylic group or acid anhydride Group in the same molecule, which is specifically exemplified by maleic anhydride, maleic acid, maleic acid monoester, maleic acid diester, maleimide, N-substituted compound thereof such as N-substituted maleimide, maleic aicd monoamide and maleic acid diamide, maleic acid ammonium salt, maleic acid metallic salt, acrylic acid, methacrylic acid, methacrylic acid ester and glycidyl methacrylate, among which is preferably used maleic anhydride in particular.

With regard to the modification of the PPO with a compound having an ethylenic double bond and a polar group in the same molecule or a derivative thereof according to the Process I, that is, solvent modification, the Maleic anhydride-modified PPO is obtained by reacting the PPO with a compound having an ethylenic double bond and a polar group in the same molecule or a derivative thereof in an aromatic hydrocarbon solvent in the presence or absence of an other type of resin in the presence of a radical generator.

The aforementioned aromatic hydrocarbon solvent is not specifically limited in its type insofar as it dissolves maleic anhydride or a derivative thereof and the radical generator and at the same time, inert to the radical generator. Specific preferable examples of such solvent include benzene, toluene, ethylbenzene, xylene, chlorobenzene and tert-butylbenzene, among which are particularly desirable those having a low chain transfer constant such as benzene, toluene, chlorobenzene and tert-butylbenzene. The solvent may be used alone or as the mixture with an other solvent. The proportion of the above-mentioned solvent to be used is not specifically limited, but may be properly selected according to various situations. In general, the proportion may be determined in the range of 1 to 20 times by weight based on the PPO to be used. A deficiency in the amount of a solvent causes malfunction as the solvent, whereas an excess in the amount undesirably lowers the efficiency of the radical generator.

The proportion of a compound having an ethylenic double bond and a polar group in the same molecule or a derivative thereof to be used as a modifier is 1 to 20, preferably 3 to 15 parts by weight per 100 parts by weight of the aforestated PPO. A proportion thereof less than 1 part by weight results in failure to sufficiently enhance the modification rate, while that exceeding 20 parts by weight necessitates sufficient purification for the purpose of removing the excessive amount of the above-mentioned compound, thus causing troublesome operation and unfavorable economical efficiency.

The radical generator to be used for the solution modification of the PPO with a compound having an ethylenic double bond and a polar group in the same molecule or a derivative thereof is not specifically limited in its type, but is preferably such that has a decomposition temperature well suited for the reaction temperature and also a large hydrogen withdrawing capacity in order that the above-mentioned compound or a derivative thereof may be effectively grafted onto the PPO. Such radical generators are specifically exemplified by but not limited to di-tert-butyl peroxide; dicumyl peroxide; 1,1-bis(tert-butyl peroxide)cyclohexane; 1,1-bis(tert-butylperoxy) 3,3,5-trimethylcyclohexane; benzoyl peroxide; and decanoyl peroxide.

The proportion of the radical generator to be used therefor should be 15 parts or less by weight based on 100 parts by weight of the PPO, since a proportion exceeding 15 parts by weight can unfavorably cause insoluble matter.

There are available a variety of procedures for modifying the PPO. Specifically the solution modification process (Process I) comprises the steps of dissolving the PPO and a compound having an ethylenic double bond and a polar group in the same molecule or a derivative thereof in an aromatic hydrocarbon solvent to form a homogeneous solution; adding to the solution a radical generator at an arbitrary temperature at which the half-life period of the agent is not longer than one (1) hour; and proceeding with the reaction at said temperature. A reaction temperature at which the half-life period of the agent to be used is longer than one (1) hour unfavorably necessitates a long reaction time. The modification reaction time is properly selected, but is preferably a prescribed temperature which is not shorter than 3 times the half-life period of the radical generator in order that the agent may effectively function. After the completion of the reaction, the reaction solution is added to a solvent hardly dissolving the PPO such as methanol, and the modified PPO thus deposited is recovered and subjected to a conventional drying step to afford the objective modified PPO.

On the other hand, in the melt modification process (Process II) there is available the PPO and a compound having an ethylenic double bond a polar group in the same molecule or a derivative thereof same as those to be used in the above-described Process I, and the objective modified PPO can be produced by melt-kneading and reacting the PPO with the above-mentioned compound or a derivative thereof at a temperature of 300° to 350° C. in the presence of the radical generator.

The proportion of the above-mentioned compound or a derivative thereof to be used for the reaction is 1 to 5, preferably 2 to 4 parts by weight based on 100 parts by weight of the PPO, since a proportion less than one (1) part by weight is insufficient for enhancing modification rate, while that exceeding 5 parts by weight undesirably lowers the utilization efficiency of the above-mentioned compound or a derivative thereof, thus increasing the residual amount of the above-mentioned comopund or the like in the objective pellet.

The radical generator to be employed in the melt modification process as Process II shall be the one in which the temperature exhibiting a half-life period of one (1) minutes is 300° C. or higher, desirably 300° to 380° C., more desirably 300° to 350°. Such temperature as higher than 380° C. sometimes results in deteriorated PPO as the product, while the aforestated temperature lower than 300° C. brings about insufficient effect on PPO modification as is the case with a peroxide or an azo compound. There are available a variety of suitable radical generators, which are specifically exemplified by 2,3-dimethyl-2,3-diphenylbutane; 2,3-diethyl-2,3-diphenylbutane; 2, 3-diethyl-2,3-diphenylhexane; 2,3-dimethyl-2,3-di(p-methylphenyl)butane. Among them is most desirably employed 2,3-dimethyl-2,3-diphenylbutane in which the temperature exhibiting a half-life period of one (1) minute is 330° C.

The proportion of the radical generator to be employed for the reaction is selected in the range of 0.1 to 3, preferably 0.5 to 2 parts by weight based on 100 parts by weight of the PPO, since the proportion less than 0.1 part by weight lowers the modification effect, whereas that exceeding 3 parts by weight unfavorably deteriorates the utilization efficiency of the radical generator in the modification and sometimes causes an insoluble component.

In the melt modification process as Process II there are available a variety of procedures for modifying the PPO. Specifically, for example, the above-described PPO, a compound having an ethylenic double bond and a polar group in the same molecule or a derivative thereof and the radical generator are subjected to uniform dry-blending at room temperature and then to melt reaction at a temperature in the range of 300° to 350° C. which is substantially the kneading temperature of the PPO. A reaction temperature lower than 300° C. results in an unfavorable high melting viscosity, while that higher than 350° C. undesirably causes PPO degradation. The melt modification can be generally carried out by melt kneading by the use of an extruder for the purpose of modification reaction. However, the melt modification is not limited to the aforesaid method, but may be put into practice by a publicly known method insofar as it enables the modification at a temperature in the range of 300° to 350° C. In addition, other thermoplastic resin may be added to the composition inasmuch as the addition thereof does not impair the effect of the present invention.

As described hereinbefore, the Maleic anhydride-modified PPO is obtained by any of the solution modification process as Process I and the melt modification process as Process II. In the present invention, the modification rate, which is the content of the compound having an ethylenic double bond and a polar group in the same molecule in the PPO modified with said compound is 1.3% or more, desirably 1.3 to 10%, particularly desirably 1.3 to 5% by weight as the optimum. A modification rate of less than 1.3% by weight is unfavorable from the viewpoint of improvement in long-term heat resistance as well as the economical efficiency, since it necessitates increase in the compounding ratio of the Maleic anhydride-modified PPO in the composition in order to develop sufficient dynamical properties and heat resistance. On the other hand, said rate exceeding 10% by weight sometimes unfavorably lowers the compatibility of the PPO with SPS. Thus, said rate in the range of 1.3 to 5.0% by weight is most effective for sufficiently developing the dynamical properties of the composition without deteriorating the long-term heat resistant stability thereof by compounding the Maleic anhydride-modified PPO only in an small amount in the composition.

As described hereinbefore, the thermoplastic resin composition comprises the above-mentioned components (A) to (C), and more specifically with regard to the compounding ratio, (A) 100 parts by weight of a styrenic polymer having a high degree of syndiotactic configuration, (B) 1 to 350, preferably 5 to 200 parts by weight of an inorganic filler and (C) 0.1 to 3.5 preferably 0.5 to 3.0 parts by weight of a Maleic anhydride-modified PPO having a modification rate of 1.3% or more by weight.

In the aforestated composition, a compounding ratio of the inorganic filler less than 1 part by weight results in failure to sufficiently exert the compounding effect thereof, whereas that exceeding 350 parts by weight unfavorably brings about such disadvantages as poor dispersibility and difficulty in molding the composition. Also, a compounding ratio of the Maleic anhydride-modified PPO less than 0.1 part by weight is not sufficient to exhibit the effect on improving the dynamical properties and heat resistance of the composition, whereas that exceeding 3.5 parts by weight undesirably results in the loss of long-term heat resistant stability.

Moreover, the thermoplastic resin composition of the present invention can be further gifted with impact resistance by being compounded with a rubbery elastomer when necessary as the component (D) in addition to the above-described components (A), (B) and (C).

Examples of the rubbery elastomers capable of providing the composition with impact resistance include natural rubber, polybutadiene rubber, polyisoprene rubber, polyisobutylene rubber, neoprene rubber, polysulfied rubber, thiokol rubber, acrylic rubber, urethane rubber, silicone rubber, epichlorohydrin rubber, styrene/butadiene block copolymer, styrene/butadiene/styrene block copolymer, hydrogenated styrene/butadiene/styrene block copolymer, styrene/isoprene block copolymer, ethylene/propylene rubber, ethylene/propylene/diolefin rubber and modified products from any of the aforementioned rubbers. Among them are particularly desirably used hydrogenated styrene/butadiene/styrene block copolymer, styrene/butadiene block copolymer, styrene/butadiene/styrene block copolymer, etc.

The compounding ratio of the rubbery elastomer is 5 to 100, preferably 10 to 80 parts by weight based on 100 parts by weight of the styrenic polymer having a high degree of syndiotactic configuration (A). A compounding ratio thereof less than 5 parts by weight unfavorably leads to insufficient effect on improving impact resistance, whereas that exceeding 100 parts by weight undesirably causes marked decrease in heat resistance and rigidity of the objective composition.

Moreover, the thermoplastic resin composition according to the present invention may be compounded with an other type of thermoplastic resin and further any of various additives insofar as an object of the present invention is not impaired. The compounding ratio of the other type of thermoplastic resin may be properly selected according to the situation, but is preferably 150 or less parts by weight based on 100 parts by weight of SPS. Examples of such resin include styrenic resin, polyolefin and polyamide, and those of the additives include antioxidant, nucleating agent, etc.

The thermoplastic resin according to the present invention is greatly improved in long-term heat resistant stability, which is further improved along with impact resistance by the combined use with the rubbery elastomer.

Consequently the thermoplastic resin composition according to the present invention can find a wide variety of effective use in molding industrial materials including electric and electronic materials such as connectors and print-curcuit board; industrial construction materials; automobile parts such as connectors to be mounted on vehicles, wheel, cap and cylinder head cover; domestic electrical appliances; various machine parts, etc.

In the following, the present invention will be described in more detail with reference to preparation examples, examples and comparative examples.

PREPARATION EXAMPLE 1

One (1) kg of PPO and 30 g of maleic anhydride were dry-blended and melt kneaded by the use of a 30 mm twin-screw extruder at a revolution of 200 rpm at a temperature set to 300° C., while the resin temperature was about 330° C. The resultant strand was cooled and then pelletized to produce maleic anhydride-modified PPO.

In order to measure the modification rate, 1 g of the resultant modified PPO was dissolved in chloroform and thereafter reprecipitated in methanol, and the recovered polymer was subjected to Soxhlet extraction using methanol and dried. The modification rate was determined from the intensity of carbonyl absorption in infrared (IR) absorption spectrum and by neutralizing titration. The results are given in Table 1.

PREPARATION EXAMPLE 2

The procedure in Preparation Example 1 was repeated except that 10 g of 2,3-dimethyl-2,3-diphenylbutane (produced by Nippon Oil & Fat Co., Ltd. under the tradename NOPHMER BC) was dry blended as the radical generator. The results are given in Table 1.

PREPARATION EXAMPLE 3

The procedure in Preparation Example 2 was repeated except that 20 g of the agent was dry blended instead of 10 g. The results are given in Table 1.

TABLE 1

| | Amount of maleic anhydride added (phr) | Type of radical generator | Amount of radical generator added (phr) | Modification rate (wt %) |
|---|---|---|---|---|
| Preparation Example 1 | 3 | — | — | 0.83 |
| Preparation Example 2 | 3 | 2,3-dimethyl-2,3-diphenylbutane | 1.0 | 1.35 |
| Preparation Example 3 | 3 | 2,3-dimethyl-2,3-diphenylbutane | 2.0 | 1.67 |

EXAMPLE 1

To 100 parts by weight of syndiotactic polystyrene (SPS, weight-average molecular weight=348,000, weight-average molecular weight Mw/number average molecular weight Mn=2.64) were added 0.5 part by weight of the maleic anhydride-modified PPO as obtained in Preparation Example 2, one (1) part by weight of aluminum p-(tert-butyl)benzoate (produced by Dainippon Ink & Chemicals, Inc. under the tradename PTBBA-A1) as the nucleating agent, 0.1 part by weight of (2,6-di-tert-butyl-4-methylphenyl )pentaerythritol diphosphite (produced by Adeka Argus Co., Ltd. under the tradename "PEP-36") as an antioxidant and 0.1 part by weight of tetrakis [methylene-3-(3', 5'-di-tert-butyl-4'-hydroxyphenyl )]-propionate (produced by Adeka Argus Co., Ltd. under the tradename "MARK A060") also as an antioxidant, and dry blended with a Henschel mixer. Subsequently the mixture was incorporated with 43 parts by weight of aminosilane-treated glass fiber (13 μm/3 mm) as the inorganic filler by side feeding and pelletized with a twin-screw extruder. The pellet was injection molded to produce test pieces for tensile test, which were subjected to tensile strength tests before and after the test for long-term heat resistance according to JIS-K-7113. The results are given in Table 2.

EXAMPLE 2 TO 6 AND COMPARATIVE EXAMPLE 1 TO 5

The procedure in Example 1 was repeated except that the amounts of maleic anhydride-modified PPO were altered. The results are given in Table 2.

TABLE 2

| | Maleic anhydride-modified PPO | | Glass fiver amount added phr | Weight-average molecular weight of SPS | | Tensile strength kg/cm² | |
|---|---|---|---|---|---|---|---|
| | type | modification rate wt % | amount added phr | | initial value | 150° C. 1,500 hr | initial value | 150° C. 1,500 hr |
| Example 1 | Production Example 2 | 1.35 | 0.5 | 43 | 348,000 | 239,000 | 1,100 | 1,050 |
| Example 2 | Production Example 2 | 1.35 | 1.5 | 43 | 348,000 | 229,000 | 1,200 | 1,130 |
| Example 3 | Production Example 2 | 1.35 | 3.0 | 43 | 348,000 | 213,000 | 1,280 | 1,200 |
| Example 4 | Production Example 3 | 1.67 | 0.5 | 43 | 348,000 | 240,000 | 1,200 | 1,100 |
| Example 5 | Production Example 3 | 1.67 | 1.5 | 43 | 348,000 | 227,000 | 1,290 | 1,230 |
| Example 6 | Production Example 3 | 1.67 | 3.0 | 43 | 348,000 | 212,000 | 1,300 | 1,260 |
| Comparative Example 1 | — | — | 0 | 43 | 348,000 | 250,000 | 990 | 810 |
| Comparative Example 2 | Production Example 1 | 0.83 | 5.0 | 43 | 348,000 | 162,000 | 1,250 | 760 |
| Comparative Example 3 | Production Example 1 | 0.83 | 10.0 | 43 | 348,000 | 72,000 | 1,250 | 680 |
| Comparative Example 4 | Production Example 3 | 1.67 | 5.0 | 43 | 348,000 | 158,000 | 1,320 | 1,130 |
| Comparative Example 5 | Production Example 3 | 1.67 | 10.0 | 43 | 348,000 | 75,000 | 1,310 | 900 |

It can be seen from Tables 1 and 2 that the dynamical properties of the composition can be improved by adding 0.1 to 3.5 parts by weight of maleic anhydride-modified PPO as compared with the comparative examples without the addition thereof, and the long-term heat resistance is improved as compared with the comparative examples with the addition thereof of 5 or more parts by weight.

It can also be seen from the tables that the dynamical properties of the composition can be economically improved to a great extent by adding the maleic anhydride-modified PPO having a modification rate of 1.3% or more by weight and at the same time the long-term heat resistance is markedly improved as compared with the cases with the addition thereof of 5 or more parts by weight.

EXAMPLE 7

To 100 parts by weight of syndiotactic polystyrene (SPS, weight-average molecular weight=348,000, weight-average molecular weight Mw/number average molecular weight Mn=2.64) were added 10 parts by weight of hydrogenated styrene/butadiene/styrene block copolymer (produced by Shell Chem. Co. under the tradename "Kraton" G1651, SEBS), 0.5 part by weight of the maleic anhydride-modified PPO as obtained in Preparation Example 2, one (1) part by weight of aluminum p-(tert-butyl) benzoate (produced by Dainippon Ink & Chemicals, Inc. under the tradename PTBBA-A1) as the nucleating agent, 0.1 part by weight of (2,6-di-tert-butyl-4-methylphenyl)pentaerythritol diphosphite (produced by Adeka Argus Co., Ltd. under the tradename "PET-36") as an antioxidant and 0.1 part by weight of tetrakis[methylene-3-(3',5'-di-tert-butyl-4'-hydroxyphenyl)]propionate (produced by Adeka Argus Co., Ltd. under the tradeneme "MARK A060") also as an antioxidant, and dry blended with a Henschel mixer. Subsequently the mixture was incorporated with 43 parts by weight of aminosilane-treated glass fiber (13 μm/3 mm) as the inorganic filler by side feeding and pelletized with a twin-screw extruder. The pellet was injection molded to produce test pieces for tensile test and Izod impact test, which were subjected to tensile strength tests and Izod impact tests before and after the test for long-term heat resistance. The results are given in Table 3.

EXAMPLE 8 TO 12 AND COMPARATIVE EXAMPLES 6 TO 10

The procedure in Example 7 was repeated except that the amounts of maleic anhydride-modified PPO were altered. The results are given in Table 3. The tensile strength test and Izod impact strength test were carried out in accordance with JIS-K-7113 and JIS-K-7110, respectively.

TABLE 3

| | Maleic anhydride-modified PPO | | Glass fiver amount added phr | SEBS amount added phr | Weight-average molecular weight of SPS | | Tensile strength kg/cm² | | Impact strength kg cm/cm | |
|---|---|---|---|---|---|---|---|---|---|---|
| | type | modification rate wt % | | | initial value | 150° C. 1,500 hr | initial value | 150° C. 1,500 hr | initial value | 150° C. 1,500 hr |
| Example 7 | Production Example 2 | 1.35 | 0.5 | 43 | 10 | 348,000 | 239,000 | 1,250 | 1,120 | 10.3 | 9.5 |
| Example 8 | Production Example 2 | 1.35 | 1.5 | 43 | 10 | 348,000 | 227,000 | 1,330 | 1,240 | 11.8 | 11.2 |
| Example 9 | Production Example 2 | 1.35 | 3.0 | 43 | 10 | 348,000 | 214,000 | 1,420 | 1,310 | 13.6 | 13.2 |
| Example 10 | Production Example 3 | 1.67 | 0.5 | 43 | 10 | 348,000 | 241,000 | 1,400 | 1,240 | 12.1 | 11.2 |
| Example 11 | Production Example 3 | 1.67 | 1.5 | 43 | 10 | 348,000 | 225,000 | 1,420 | 1,320 | 13.4 | 12.9 |

TABLE 3-continued

|  | Maleic anhydride-modified PPO | | Glass fiver amount added phr | SEBS amount added phr | Weight-average molecular weight of SPS | | Tensile strength kg/cm² | | Impact strength kg cm/cm | |
|---|---|---|---|---|---|---|---|---|---|---|
|  | type | modification rate wt % amount added phr | | | initial value | 150° C. 1,500 hr | initial value | 150° C. 1,500 hr | initial value | 150° C. 1,500 hr |
| Example 12 | Production Example 3 | 1.67  3.0 | 43 | 10 | 348,000 | 212,000 | 1,430 | 1,340 | 14.0 | 13.6 |
| Comparative Example 6 | — | —  0 | 43 | 10 | 348,000 | 250,000 | 950 | 840 | 7.5 | 7.2 |
| Comparative Example 7 | Production Example 1 | 0.83  5.0 | 43 | 10 | 348,000 | 161,000 | 1,360 | 750 | 13.5 | 6.4 |
| Comparative Example 8 | Production Example 1 | 0.83  10.0 | 43 | 10 | 348,000 | 72,000 | 1,430 | 620 | 13.9 | 3.2 |
| Comparative Example 9 | Production Example 3 | 1.67  5.0 | 43 | 10 | 348,000 | 160,000 | 1,460 | 1,130 | 14.5 | 6.3 |
| Comparative Example 10 | Production Example 3 | 1.67  10.0 | 43 | 10 | 348,000 | 75,000 | 1,450 | 990 | 14.8 | 3.4 |

It can be seen from Table 3 that the dynamical properties of the composition can be improved by adding 0.1 to 3.5 parts by weight of maleic anhydride-modified PPO as compared with the comparative examples without the addition thereof, and the long-term heat resistance is improved as compared with the comparative examples with the addition thereof of 5 or more parts by weight.

It can also be seen from the tables that the dynamical propertise of the composition can be economically improved to a great extent by adding the maleic anhydride-modified PPO having a modification rate of 1.3% or more by weight and at the same time the long-term heat resistance is markedly improved as compared with the cases with the addition thereof of 5 more parts by weight.

EXAMPLE 13

100 g of PPO having an intrinsic viscosity [$\eta$] of 0.47 dl/g as measured in chloroform at 25° C. and 10 g of maleic anhydride were dissolved in 150 ml of toluene with heating up to 110° C., and the resultant solution was incorporated with 5.0 g of 1,1-bis( tert-butylperoxy )-3,3,5-trimethylcyclohexane (produced by Nippon Oil and Fats Co., Ltd. under the tradename "PERHEXA-3M") to proceed with modification reaction for 4 hours. The resultant reaction solution was added to one (1) liter of methanol to recover the deposited polymer.

The presence of unmodified PPO was judged by dissolving one (1) g of the recovered polymer in 50 ml of methylene chloride, allowing the solution to stand for 3 hours and observing the presence of deposit, and also by thin-layer chromatography using silica gel along with the existence of impurities. The modification rate of the polymer thus obtained was determined by dissolving one (1) g of the resultant modified PPO in chloroform, reprecipitating it in methanol, subjecting the recovered polymer to Soxhlet extraction using methanol, drying the polymer, measuring the intensity of carbonyl absorption in infrared (IR) absorption spectrum and conducting neutralizing titration. The results are given in Table 4.

The modification rate of the modified PPO was determined from neutralizing titration in accordance with the following procedures.

Procedure (1)

One (1) g of the modified PPO after drying was dissolved in the mixed solvent of 100 ml of chloroform and 20 ml of ethanol each had been dehydrated with molecular sieve. To the solution thus obtained was added phenolphthalein as the titration indicator and the resultant solution was titrated with 0.05 N solution of potassium hydroxide in ethanol (titration solution) until neutral with the indicator to obtain the quantity of the titration solution required for neutralization ($K_1$).

Procedure (2)

The procedure in Procedure (1) was repeated except that unmodified PPO was employed in place of the modified PPO to obtain the quantity of the titration solution required for neutralization ($k_2$).

Procedure (3)

The procedure in Procedure (1) was repeated except that succimic anhydride was used in place of the modified PPO to determine the neutralization equivalent for the titration solution of the modified PPO (maleic anhydride-modified PPO). As the result, it was proved that about one (1) equivalent of potassium hydroxide was necessary per one (1) equivalent of succinic anhydride. The reason for using succinic anhydride in the procedure is that maleic anhydride is presumed to react with PPO and saturate C=C bond thereof into C—C bond.

Procedure (4)

The titre for the Groups derived from maleic anhydride in PPO (K) (herein after simply referred to as "maleic anhydride Groups") was obtained by substracting the quantity of the titration solution required in Procedure (2) ($K_1$) from that required in Procedure (1) ($K_1$) as expressed by the following formula:

$$K = K_1 - K_2$$

On the basis of the result in Procedure (3) that in neutralizing the maleic anhydride Groups in the modified PPO, one (1) equivalent of potassium hydroxide is necessary per one (1) equivalent of maleic anhydride Groups, the quantity of maleic anhydride Groups in the modified PPO was calculated. The modification rate of the modified PPO was obtained as the ratio in % by weight of the quantity of maleic anhydride Groups calculated in the above manner to the modified PPO.

Example 14

The procedure in Example 13 was repeated except that the amount of the PERHEXA-3M was altered. The results are given in Table 4.

EXAMPLES 15 TO 16

The procedure in Example 13 was repeated except that ethylbenzene was used as the solvent in place of toluene, a different amount of di-tert-butyl peroxide (produced by Nippon Oil & Fats Co., Ltd. under the tradename "PERBUTYL-D") was used as the radical generating agent in place of 1,1-bis( tert-butylperoxy )-3,3,5-trimethylcyclohexane, and the reaction was carried out at 145° C. The results are given in Table 4.

COMPARATIVE EXAMPLE 10

The procedure in Example 13 was repeated except that 1 kg of PPO same as that in Example 13 was dry blended with 50 g of maleic anhydride at room temperature and the resultant blend was subjected to modification reaction by melt kneading at 300° C. by the use of a 30 mm twin-screw extruder. The results are given in Table 4.

COMPARATIVE EXAMPLE 11

The procedure in Comparative Example 10 was repeated except that dicumyl peroxide (produced by Nippon Oil & Fats Co., Ltd. under the tradename "PERCUMYL-D") was added to the composition. The results are given in Table 4.

blended with 3 parts by weight of the maleic anhydride-modified PPO as prepared in Example 14, and the resultant blend was kneaded by the use of a 30 mm twin-screw extruder at 300° C. at a revolution of 200 rpm, while being fed with 43 parts by weight of aminosilane-treated glass fiber to afford pellet. The resultant pellet was molded, and the molding thus obtained was tested for dynamical properties and heat resistance. The results are given in Table 5.

EXAMPLE 18

The procedure in Example 17 was repeated except that 0.5 part by weight of the maleic anhydride-modified PPO as prepared in Example 14 was used instead of 3 parts by weight. The test results are given in Table 5.

COMPARATIVE EXAMPLE 12

The procedure in Example 17 was repeated except that 3 parts by weight of the maleic anhydride-modified PPO as prepared in Comparative Example 10 was used. The test results are given in Table 5.

COMPARATIVE EXAMPLE 13

The procedure in Example 17 was repeated except that 0.5 part by weight of the maleic anhydride-modified PPO as prepared in Comparative Example 10 was

TABLE 4

|  | Modification method | Type of radical generator | Amount of radical generator added (phr) | Modification rate (wt %) | Presence of unmodified PPO[1] | Impurity[2] | Hue[3] |
| --- | --- | --- | --- | --- | --- | --- | --- |
| Example 13 | solution modification | PERHEXA-3M | 5.0 | 1.77 | ⊙ | ⊙ | ⊙ |
| Example 14 | solution modification | PERHEXA-3M | 10.0 | 3.39 | ⊙ | ⊙ | ○ |
| Example 15 | solution modification | PERBUTYL-D | 5.0 | 1.54 | ⊙ | ○ | ⊙ |
| Example 16 | solution modification | PERBUTYL-D | 10.0 | 3.01 | ⊙ | ○ | ○ |
| Comparative Example 10 | melt modification | none | 0 | 0.83 | x | x | Δ |
| Comparative Example 11 | melt modification | PERCUMYL-D | 1.0 | 0.78 | x | x | x |

[1] Amount of unmodified PPO deposited   little ⊙ < ○ < Δ < x  much
[2] Amount of impurities   little ⊙ < ○ < Δ < x  much
[3] Visual observation   good ⊙ < ○ < Δ < x  bad It can be seen from Table 4 that it is made possible by the solution modification to increase the modification rate of PPO, decrease impurities and residual unmodified PPO and improve the hue of the objective product.

EXAMPLE 17

100 parts by weight of SPS having a weight-average molecular weight (Mw) of 400,000 and Mw/Mn ratio of 2.5 (Mn:number-average molecular weight) was dry-used. The test results are given in Table 5.

TABLE 5

|  | Modification rate of PPO (wt %) | Amount added (phr) | Izod impact strength[1] (kg·cm/cm) | Flexural modulus of elasticity[2] (kg/cm²) | Heat distortion temperature at high load[3] (°C.) | Hue[4] | Long-term heat resistance at 130° C.[5] (1000 hr) |
| --- | --- | --- | --- | --- | --- | --- | --- |
| Example 17 | 3.39 | 3.0 | 11.1 | 104000 | 257 | ○ | ○ |
| Example 18 | 3.39 | 0.5 | 7.9 | 106000 | 254 | ○ | ○ |
| Comparative Example 12 | 0.83 | 3.0 | 11.0 | 104000 | 257 | x |  |
| Comparative Example 13 | 0.83 | 0.5 | 5.9 | 102000 | 247 |  | ○ |

[1] According to JIS-K-7110
[2] According to JIS-K-7203
[3] According to JIS-K-7207 (18.6 kg/cm²)
[4] Visual observation   good ⊙ < ○ < Δ < x  bad
[5] Retention of tensile strength It is clear from Table 5 that the increased modification rate and the decreased impurities by virtue of the solution modification process (Process I) are effective for improving the dynamical properties, hue and heat resistant stability of the glass fiber-reinforced thermoplastic resin.

Since as mentioned above the modified PPO obtained by the Process I is enhanced in modification rate and free from impurities, only a small amount of the above PPO added to a styrenic polymer alloy or a composition thereof can improve the dynamical properteis and heat resistance, and as compared with the prior arts, the heat resistant stability as well.

EXAMPLE 19

One (1) kg of PPO same as that in Example 13, 30 g of maleic anhydride and 10 g of 2,3-dimethyl-2,3-diphenylbutane (produced by Nippon Oil & Fats Co., Ltd. under the tradename "NOPHMER BC") as the radical Generator were dry-blended and melt-kneaded by the use a 30 mm twin-screw extruder at a revolution of 200 rpm at a temperature set to 300° C., while the resin temperature was 300° C., approximately. The resultant strand was cooled and then pelletized to produce maleic anhydride-modified PPO.

In order to measure the modification rate, one (1) g of the resultant modified PPO was dissolved in chloroform and thereafter reprecipitated in methanol, and the recovered polymer was subjected to Soxhlet extraction and dried. The modification rate was determined from the intensity of carbonyl absorption in IR absorption spectrum and by nectralizing titration. The results are Given in Table 6.

EXAMPLES 20 TO 22

The procedure in Example 19 was repeated except that the amounts of the maleic anhydride-modified PPO and NOPHMER BC were altered as in Table 6. The test results are given in Table 6.

COMPARATIVE EXAMPLE 14

The procedure in Example 19 was repeated except that any radical generator was not added. The test results are given in Table 6.

COMPARATIVE EXAMPLE 15

The procedure in Example 19 was repeated except that 50 g of maleic anhydride was added and any radical generator was not added. The test results are given in Table 6.

COMPARATIVE EXAMPLES 16 TO 23

The procedure in Example 19 was repeated except that the amounts of maleic anhydride added and the types of radical generators were altered. The test results are given in Table 6.

TABLE 6

| | Amount of maleic anhydride added (phr) | Type of radical generator | Amount of radical generator added (phr) | Modification rate (wt %) |
|---|---|---|---|---|
| Example 19 | 3 | 2,3-dimethyl-2-3-diphenylbutane | 1.0 | 1.35 |
| Example 20 | 3 | 2-3-dimethyl-2-3-diphenylbutane | 2.0 | 1.67 |
| Example 21 | 5 | 2,3-dimethyl-2,3-diphenylbutane | 1.0 | 1.45 |
| Example 22 | 5 | 2,3-dimethyl-2,3-diphenylbutane | 2.0 | 1.98 |
| Comparative Example 14 | 3 | — | — | 0.83 |
| Comparative Example 15 | 5 | — | — | 0.92 |
| Comparative Example 16 | 3 | benzoyl peroxide | 1.0 | 0.80 |
| Comparative Example 17 | 3 | dicumyl peroxide | 1.0 | 0.78 |
| Comparative Example 18 | 3 | di-tert-butyl peroxide | 1.0 | 0.81 |
| Comparative Example 19 | 3 | cumene hydroperoxide | 1.0 | 0.81 |
| Comparative Example 20 | 3 | tert-butyl hydroperoxide | 1.0 | 0.85 |
| Comparative Example 21 | 3 | 1,1,3,3,-tetramethylbutyl hydroperoxide | 1.0 | 0.86 |
| Comparative Example 22 | 3 | azobis(isobutyro)nitrile | 1.0 | 0.80 |
| Comparative Example 23 | 3 | 1,1',-azobis(cyclohexane-1-carbonitrile) | 1.0 | 0.84 |

As is clear from the results in Table 6, the modification rate of the maleic anhydride-modified PPO can be improved by the addition of a radical generator. However, as is clear from the results in Comparative Examples 16 to 23, the use of the peroxide or azo compound which has heretofore been employed as a radical generator and is instantaneously decomposed at the PPO's substantial kneading temperature does very little in contributing to the modification of PPO. On the other hand, even a small amount of 2,3-dimethyl-2,3-diphenylbutane, when used as the radical generator in the present invention (Process II), can remarkably improve the modification rate and facilitates the production of the maleic anhydride-modified PPO at a modification rate higher than that in the conventional method by the use of a simplified extruder.

EXAMPLE 23

100 parts by weight of SPS having a Mw of 400,000 and Mw/Mn ratio of 2.5 was dry-blended with one (1) part by weight of the maleic anhydride-modified PPO as prepared in Example 19, and the resultant blend was kneaded by the use of a 30 mm twin-screw extruder at 300° C. at a revolution of 200 rpm, while being fed with 43 parts by weight of aminosilane-treated glass fiber to produce pellet. The pellet thus obtained was molded, and the resultant molding was tested for dynamical properteis and heat resistance. The results are given in Table 7.

EXAMPLE 24

The procedure in Example 23 was repeated except that one (1) part by weight of the maleic anhydride-modified PPO as prepared in Example 20 was employed. The test results are given in Table 7.

COMPARATIVE EXAMPLES 24 AND 25

The procedure in Example 23 was repeated except that one (1) part by weight of the maleic anhydride-modified PPO as prepared in Comparative Examples 18 and 21, respectively was employed. The test results are given in Table 7.

place of maleic anhydride. The results are given in Table 8.

TABLE 7

|  | Modification rate of PPO (wt %) | Amount added (phr) | Izod impact strength with notch (kg · cm/cm) | Izod impact strength without notch (kg · cm/cm) | Flexural strength[2] (kg · cm/cm$^2$) | Heat distortin temperature at high load[3] (°C.) |
|---|---|---|---|---|---|---|
| Example 23 | 1.45 | 1.0 | 9.5 | 42 | 1870 | 257 |
| Example 24 | 1.67 | 1.0 | 10.1 | 44 | 1890 | 257 |
| Comparative Example 24 | 0.80 | 1.0 | 7.5 | 31 | 1680 | 253 |
| Comparative Example 25 | 0.87 | 1.0 | 7.5 | 32 | 1700 | 254 |

[1] According to JIS-K-7110
[2] According to JIS-K-7203
[3] According to JIS-K-7207 (18.6 kg/cm$^2$)

TABLE 8

|  | Modification method | Type of radical generator | Amount of radical generator (phr) | Modification rate (wt %) | Presence of unmodified PPO | Impurity | Hue |
|---|---|---|---|---|---|---|---|
| Example 25 | solution modification | PERHEXA-3M | 10.0 | 3.01 | ⊙ | ⊙ | ○ |
| Comparative Example 26 | melt modification | none | — | 0.77 | x | x | Δ |

Note;
Each symbol is as defined in Table 4.

As is clear from the test results in Table 7, increased modification rate of PPO even at the same amount thereof enables the manifestation of the dynamical properties and heat resistance of the objective composition that are superior to those of the conventional product, thereby making contributions to the improvement in adhesion between SPS-based resin and inorganic fillers in SPS-based resin compositions, as well as to the production of the modified PPO useful for the purpose of improving compatibility among the components of alloy-based composition.

As described above, the melt modification process (Process II) according to the present invention enables the production of the modified PPO enhanced in modification rate with simplified operation by the use of the radical generating agent having a decomposition temperature higher than those of the conventional agent. Likewise, the modified PPO produced by the Process II is capable of improving the dynamical properties and heat resistance of a styrenic polymer alloy or the composition thereof only by a small amount added to said alloy or the composition.

EXAMPLE 25

The procedure in Example 14 was repeated except that glycidyl methacrylate was used in place of maleic anhydride. The results are given in Table 8.

COMPARATIVE EXAMPLE 26

The procedure in Comparative Example 10 was repeated except that glycidyl methacrylate was used in place of maleic anhydride. The results are given in Table 8.

EXAMPLE 26

The procedure in Example 17 was repeated except that 3 parts by weight of the glycidyl methacrylate-modified PPO as prepared in Example 25 was used. The results are given in Table 9.

COMPARATIVE EXAMPLE 27

The procedure in Example 17 was repeated except that 3 parts by weight of the glycidyl methacrylate-modified PPO as prepared in Comparative Example 26 was used. The results are given In Table 9.

TABLE 9

|  | Modificatin rate of PPO (wt %) | Amount added (phr) | Izod Impact strength (kg · cm/cm) | Flexural modulus of elasticity (kg/cm$^2$) | Heat distortion temperature at high load (°C.) | Hue | Long-term heat resistance |
|---|---|---|---|---|---|---|---|
| Example 26 | 3.01 | 3.0 | 10.5 | 102000 | 256 | ○ | ○ |
| Comparative Example 27 | 0.77 | 3.0 | 10.8 | 102000 | 255 | x | Δ |

Note;
Each symbol is as defined in Table 5.

EXAMPLE 27

The procedure in Example 19 was repeated except that glycidyl methacrylate was used in place of maleic anhydride. The results are given in Table 10.

COMPARATIVE EXAMPLE 28

The procedure in Comparative Example 17 was repeated except that glycidyl methacrylate was used in place of maleic anhydride. The results are Given in Table 10.

TABLE 10

| | Amount of glycidyl methacrylate (phr) | Type of radical generator | Amount of radical generator (phr) | Modification rate (wt %) |
|---|---|---|---|---|
| Example 27 | 3 | 2,3-dimethyl-2,3-diphenylbutane | 1.0 | 1.60 |
| Comparative Example 28 | 3 | dicumyl peroxide | 1.0 | 0.80 |

EXAMPLE 28

The procedure in Example 23 was repeated except that 1 part by weight of the glycidyl methacrylate-modified PPO as prepared in Example 27 was used. The results are given in Table 11.

COMPARATIVE EXAMPLE 29

The procedure in Example 23 was repeated except that 1 part by weight of the glycidyl methacrylate-modified PPO as prepared in Comparative Example 28 was use. The results are given in Table 11.

TABLE 11

| | Modification rate of PPO (wt %) | Amount added (phr) | Izod impact strength (kg · cm/cm) | | Flexural strength (kg · cm/cm$^2$) | Heat distortin temperature at high load (°C.) |
|---|---|---|---|---|---|---|
| | | | with notch | without notch | | |
| Example 28 | 1.60 | 1.0 | 9.8 | 40 | 1850 | 256 |
| Comparative Example 29 | 0.80 | 1.0 | 7.0 | 33 | 1660 | 252 |

What is claimed is:

1. A thermoplastic resin composition which comprises (A) 100 parts by weight of a styrenic polymer having a high degree of syndiotactic configuration, (B) 1 to 350 parts by weight of an inorganic filler and (C) 0.1 to 3.5 parts by weight of a polyphenylene ether that is modified with a compound having an ethylenic double bond and a polar group in the same molecule, said ether having a modification rate of 1.3% to 10% by weight.

2. A thermoplastic resin composition which comprises (A) 100 parts by weight of a styrenic polymer having a high degree of syndiotactic configuration, (B) 1 to 350 parts by weight of an inorganic filler, (D) 5 to 100 parts by weight of a rubbery elastomer and (C) 0.1 to 3.5 parts by weight of a polyphenylene ether that is modified with a compound having an ethylenic double bond and a polar group in the same molecule, said ether having a modification rate of 1.3% to 10% by weight.

3. The composition according to claim 1 wherein the inorganic filler is a surface-treated inorganic filler.

4. The composition according to claim 2 wherein the inorganic filler is a surface-treated inorganic filler.

5. The composition according to claim 1 wherein said compound is selected from maleic anhydride and glycidyl methacrylate.

6. The composition according to claim 2 wherein said compound is selected from maleic anhydride and glycidyl methacrylate.

7. The composition according to claim 1 which comprises the polyphenylene ether that is modified with a compound having an ethylenic double bond and a polar group in the same molecule, said ether having a modification rate of 1.3% to 10% by weight and being produced by a process which comprises reacting 100 parts by weight of a polyphenylene ether consisting of the repeating units each represented by the general formula (I)

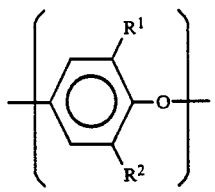

wherein R$^1$ and R$^2$ are each an alkyl group having 1 to 4 carbon atoms or a halogen atom, with 1 to 20 parts by weight of the compound having an ethylenic double bond and a polar group in the same molecule in an aromatic hydrocarbon solvent in the presence of 15 or less parts by weight of a radical generator.

8. The composition according to claim 1 which comprises the polyphenylene ether that is modified with a compound having an ethylenic double bond and a polar group in the same molecule, said ether having a modification rate of 1.3% to 10% by weight and being produced by a process which comprises reacting 100 parts by weight of a polyphenylene ether consisting of the repeating units each represented by the general formula (I)

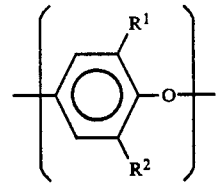

wherein R$^1$ and R$^2$ are each an alkyl group having 1 to 4 carbon atoms or a halogen atom, with 1 to 5 parts by weight of the compound having an ethylenic double bond and a polar group in the same molecule at a temperature of 300° to 350° C. in the presence of 0.1 to 3 parts by weight of a radical generator which exhibits a half-life period of one (1) minute at 300° C. or higher.

9. The composition according to claim 2 which comprises the polyphenylene ether that is modified with a compound having an ethylenic double bond and a polar group in the same molecule, said ether having a modification rate of 1.3% to 10% by weight and being produced by a process which comprises reacting 100 parts by weight of a polyphenylene ether consisting of the repeating units each represented by the general formula (I)

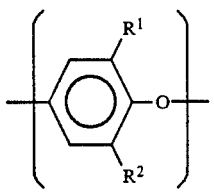

(I)

wherein R¹ and R² are each an alkyl group having 1 to 4 carbon atoms or a halogen atom, with 1 to 20 parts by weight of the compound having an ethylenic double bond and a polar group in the same molecule in an aromatic hydrocarbon solvent in the presence of 15 or less parts by weight of a radical generator.

10. The composition according to claim 2 which comprises the polyphenylene ether that is modified with a compound having an ethylenic double bond and a polar group in the same molecule, said ether having a modification rate of 1.3% to 10% by weight and being produced by a process which comprises reacting 100 parts by weight of a polyphenylene ether consisting of the repeating units each represented by the general formula (I)

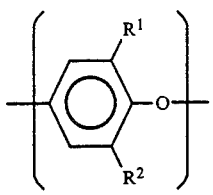

(I)

wherein R¹ and R² are each an alkyl group having 1 to 4 carbon atoms or a halogen atom, with 1 to 5 parts by weight of the compound having an ethylenic double bond and a polar group in the same molecule at a temperature of 300° to 350° C. in the presence of 0.1 to 3 parts by weight of a radical generator which exhibits a half-life period of one (1) minute at 300° C. or higher.

* * * * *